United States Patent
Shih et al.

(10) Patent No.: US 9,548,392 B2
(45) Date of Patent: Jan. 17, 2017

(54) THIN FILM TRANSISTOR AND METHOD OF MANUFACTURING SAME

(71) Applicant: HON HAI PRECISION INDUSTRY CO., LTD., New Taipei (TW)

(72) Inventors: Po-Li Shih, Hsinchu (TW); Yi-Chun Kao, Hsinchu (TW); Chih-Lung Lee, Hsinchu (TW); Kuo-Lung Fang, Hsinchu (TW); Hsin-Hua Lin, Hsinchu (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 14/834,608

(22) Filed: Aug. 25, 2015

(65) Prior Publication Data

US 2016/0351719 A1  Dec. 1, 2016

(30) Foreign Application Priority Data

May 28, 2015  (TW) .............................. 104117092 A

(51) Int. Cl.
*H01L 29/10* (2006.01)
*H01L 29/786* (2006.01)
*H01L 27/12* (2006.01)

(52) U.S. Cl.
CPC ..... *H01L 29/78606* (2013.01); *H01L 27/1288* (2013.01)

(58) Field of Classification Search
CPC ........... H01L 29/7869; H01L 29/42384; H01L 29/78693; H01L 29/41733; H01L 29/786; H01L 29/78696
USPC .............................. 257/57, 66; 438/149–167
See application file for complete search history.

(56) References Cited

U.S. PATENT DOCUMENTS

| | | | |
|---|---|---|---|
| 2013/0009219 A1* | 1/2013 | Yamazaki | H01L 29/7869 257/288 |
| 2013/0082263 A1* | 4/2013 | Honda | H01L 29/7869 257/57 |

\* cited by examiner

*Primary Examiner* — Brook Kebede
(74) *Attorney, Agent, or Firm* — Zhigang Ma

(57) ABSTRACT

A method for manufacturing a thin film transistor include following steps. A substrate is provided. A gate electrode and an electrically insulating layer are formed on the substrate. An electric conducting layer is formed on the electrically insulating layer. A first photoresist pattern layer is formed on the electric conducting layer. A portion of the electric conducting layer which is not covered by the first photoresist pattern layer is etched to form an electric conduction layer. A semiconductor layer is formed on the electric conduction layer. A second photoresist pattern layer is formed. A portion of the semiconductor layer which is not covered by the second photoresist pattern layer is etched to form the channel layer covering the electric conduction layer. A source electrode and a drain electrode are formed at the two lateral portions of the channel layer respectively. The thin film transistor is also provided.

17 Claims, 12 Drawing Sheets

THIN FILM TRANSISTOR AND METHOD OF MANUFACTURING SAME

FIELD

The subject matter herein generally relates to a thin film transistor and a method for manufacturing the thin film transistor.

BACKGROUND

Thin film transistors can be used as a switch member in display or touch sensitive areas. The thin film transistor generally includes a gate electrode on a substrate, an electrically insulating layer covering the gate electrode, a channel layer located on the electrically insulating layer, a source electrode and a drain electrode located on two sides of the channel layer respectively. The thin film transistor can further include an electric conduction layer between the channel layer and the electrically insulating layer. In manufacturing the thin film transistor, a plurality of masking steps of photolithographic processes are applied to form the channel layer and the electric conduction layer.

BRIEF DESCRIPTION OF THE DRAWINGS

Implementations of the present technology will now be described, by way of example only, with reference to the attached figures.

DETAILED DESCRIPTION

Figure 1:
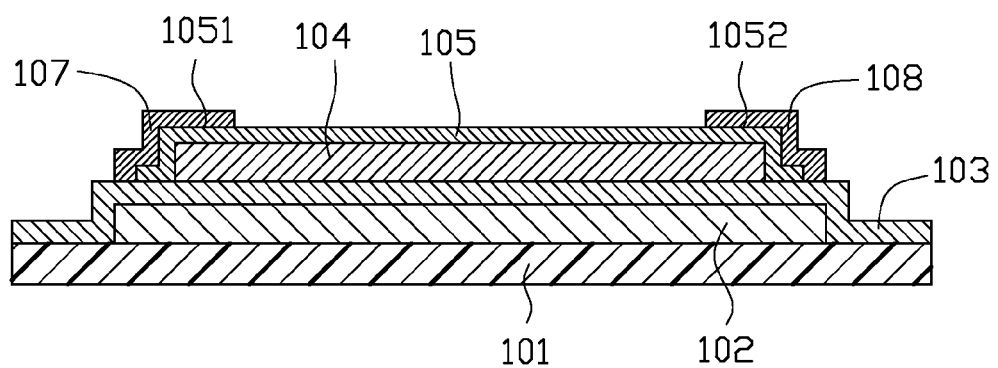
FIG. 1 is a cross-sectional view of a thin film transistor in accordance with a first embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

Several definitions that apply throughout this disclosure will now be presented.

The term "comprising," when utilized, means "including, but not necessarily limited to"; it specifically indicates open-ended inclusion or membership in the so-described combination, group, series and the like.

The present disclosure is described in relation to a method for manufacturing a thin film transistor. The method can include following steps. A substrate is provided. A gate electrode and an electrically insulating layer are formed on the substrate successively. An electric conducting layer is formed on the electrically insulating layer. A first photoresist layer is formed on the electric conducting layer. The first photoresist layer is photolithographed from a top face and a bottom face by using a photo mask as a top face photo mask and the gate electrode as a bottom face photo mask, to form a first photoresist pattern layer. Which is not covered by the first photoresist pattern layer, of the electric conducting layer is etched to form an electric conduction layer. A semiconductor layer is formed on the electric conduction layer, forming a second photoresist layer on the semiconductor layer. The second photoresist layer is photolithographed from a top face and a bottom face by using the photo mask as a top face photo mask and the gate electrode as a bottom face photo mask, to form a second photoresist pattern layer. Which is not covered by the second photoresist pattern layer, of the semiconductor layer is etched to form the channel layer covering the electric conduction layer. A source electrode and a drain electrode are formed at the two lateral portions of the channel layer respectively.

The present disclosure is described further in relation to a thin film transistor. The thin film transistor can include a substrate, a gate electrode on the substrate, an electrically insulating layer entirely covering the gate electrode on the substrate, an electric conduction layer on the electrically insulating layer, a channel layer on the electric conduction layer, a source electrode and a drain electrode located on and contacting the channel layer.

FIG. 1 illustrates a thin film transistor 100 of a first embodiment of the present disclosure. The thin film transistor 100 can be used as a switch member. The thin film transistor 100 can include a substrate 101, a gate electrode 102 on the substrate 101, an electrically insulating layer 103 covering the gate electrode 102 on the substrate 101, an electric conduction layer 104 on the electrically insulating layer 103 and corresponding to the gate electrode 102, a channel layer 105 covering the electric conduction layer 104 on the electrically insulating layer 103, a source electrode 107 and a drain electrode 108 covering two lateral portions of the channel layer 105 respectively.

The substrate 101 includes a first face facing the gate electrode 102 and the electrically insulating layer 103, and a second face opposite to the first face.

In at least one embodiment, the gate electrode 102 is located one a middle portion of the first face of the substrate 101.

The electrically insulating layer 103 can totally cover the gate electrode 102 on the first face of the substrate 101. The electrically insulating layer 103 covers a top face and a lateral face of the gate electrode 102. The electrically insulating layer 103 separates the gate electrode 102 apart from and to electrically insulate to the electric conduction layer 104, the channel layer 105, the source electrode 107 and the drain electrode 108.

The channel layer 105 can totally cover the electric conduction layer 104 on the electrically insulating layer 103. The channel layer 105 covers a top face and a lateral face of the electric conduction layer 104. The channel layer 105 separates the source electrode 107 apart from the electric conduction layer 104, and separates the drain layer 108 apart from the electric conduction layer 104.

In at least one embodiment, the channel layer 105 can include a first contacting portion 1051 and a second contacting portion 1052 spaced apart from the first contacting portion 1051. The first contacting portion 1051 and the second contacting portion 1052 can be two lateral portions of the channel layer 105. The first contacting portion 1051 is located between the source electrode 107 and the electric conduction layer 104. The second contacting portion 1052 is located between the drain electrode 108 and the electric conduction layer 104. The source electrode 107 covers the first contacting portion 1051. The drain electrode 108 covers the second contacting portion 1052. In use, electric current from the source electrode 107 can be conducted to drain electrode 108 via the first contacting portion 1051, the electric conduction layer 104 and second contacting portion 1052 in order.

In at least one embodiment, the source electrode 107 and the drain electrode 108 have a material that is the same as that of the electric conduction layer 104. Each of the electric conduction layer 104, the source electrode 107 and the drain electrode 108 can be transparent. In at least one alternatively embodiment, the materials of the electric conduction layer 104, the source electrode 107 and the drain electrode 108 can be different from each other. The material of the electric conduction layer 104 can be indium tin oxide (ITO), antimony tin oxide (ATO), silver nanowire, indium zinc oxide (IZO), carbon nanotubes, or other transparent electric conduction materials.

A material of the channel 105 can be amorphous silicon such as intrinsic amorphous silicon, N type amorphous silicon, crystal silicon, oxide semiconductor, organic material, or a mixture thereof. Wherein the oxide semiconductor can include and not be limited to indium gallium zinc oxide (IGZO).

Figure 2:
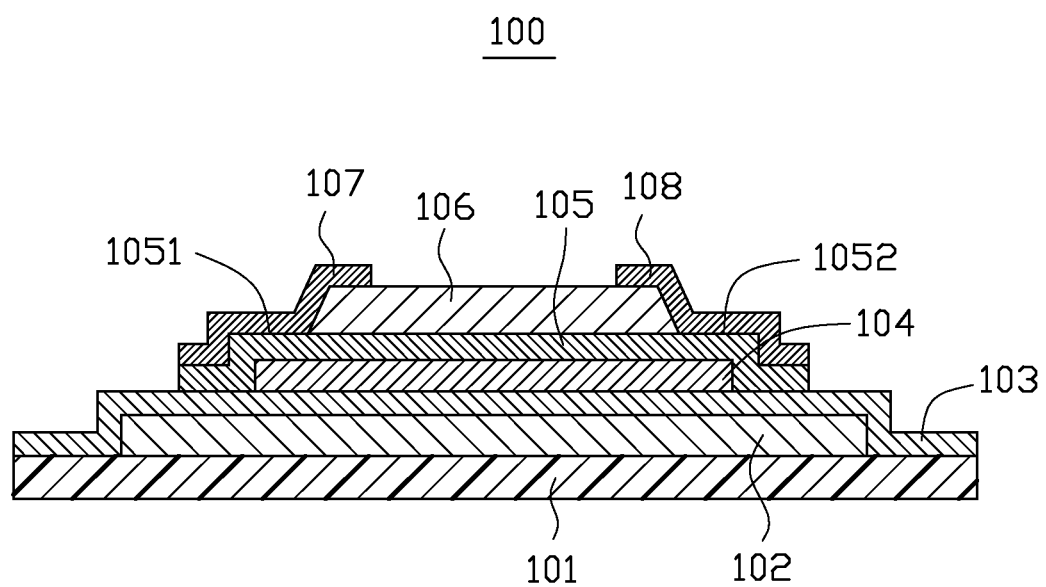
FIG. 2 is a cross-sectional view of a thin film transistor in accordance with a second embodiment of the present disclosure.

FIG. 2 illustrates a second embodiment of the thin film transistor 100. Different from the first embodiment, the thin film transistor 100 in this embodiment further includes an etch stop layer 106. In this embodiment, the material of the channel layer 105 is the oxide semiconductor. The etch stop layer 106 is located on a middle portion of the channel layer 105. The source electrode 107 and the drain electrode 108 cover two opposite lateral portions of the etch stop layer 106 respectively, and cover the first contacting portion 1051 and the second contacting portion 1052 of the channel layer 105 respectively.

Figure 3:
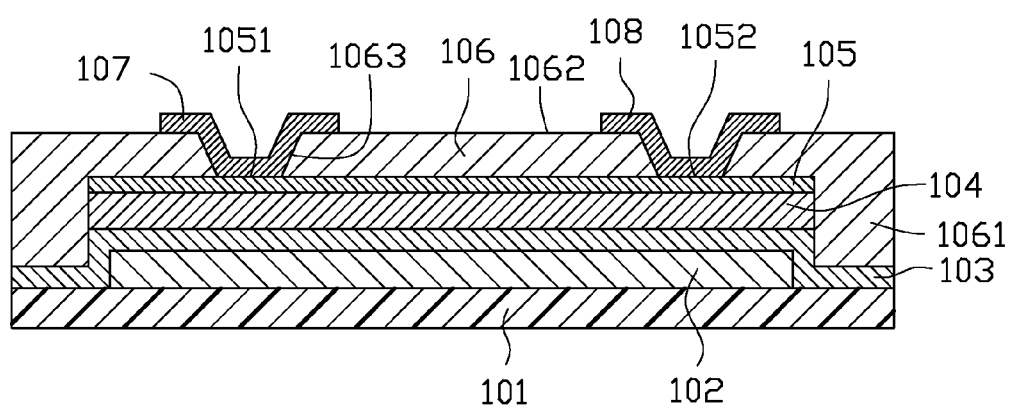
FIG. 3 is a cross-sectional view of a thin film transistor in accordance with a third embodiment of the present disclosure.

FIG. 3 illustrates a third embodiment of the thin film transistor 100. Different from the second embodiment, the thin film transistor 100 in this embodiment has the etch stop layer 106 covering the channel layer 105, the electric conduction layer 104 on the electrically insulating layer 103. The etch stop layer 106 can entirely cover a top face and lateral faces of the channel layer 105 and the electric conduction layer 104. The etch stop layer 106 has a periphery portion 1061 surrounding and covering the lateral faces of the channel layer 105 and the electric conduction layer 104, and a main portion 1062 located on and covering the top face of the channel layer 105. The periphery portion 1061 has end face contacting the electrically insulating layer 103. The main portion 1062 of the etch stop layer 106 defines two spaced through holes 1063 corresponding to the first contacting portion 1051 and the second contacting portion 1052, respectively. The source electrode 107 and the drain electrode are received in the through holes 1063 corresponding to and contacting the first contacting portion 1051 and the second contacting portion 1052, respectively.

Figure 4:
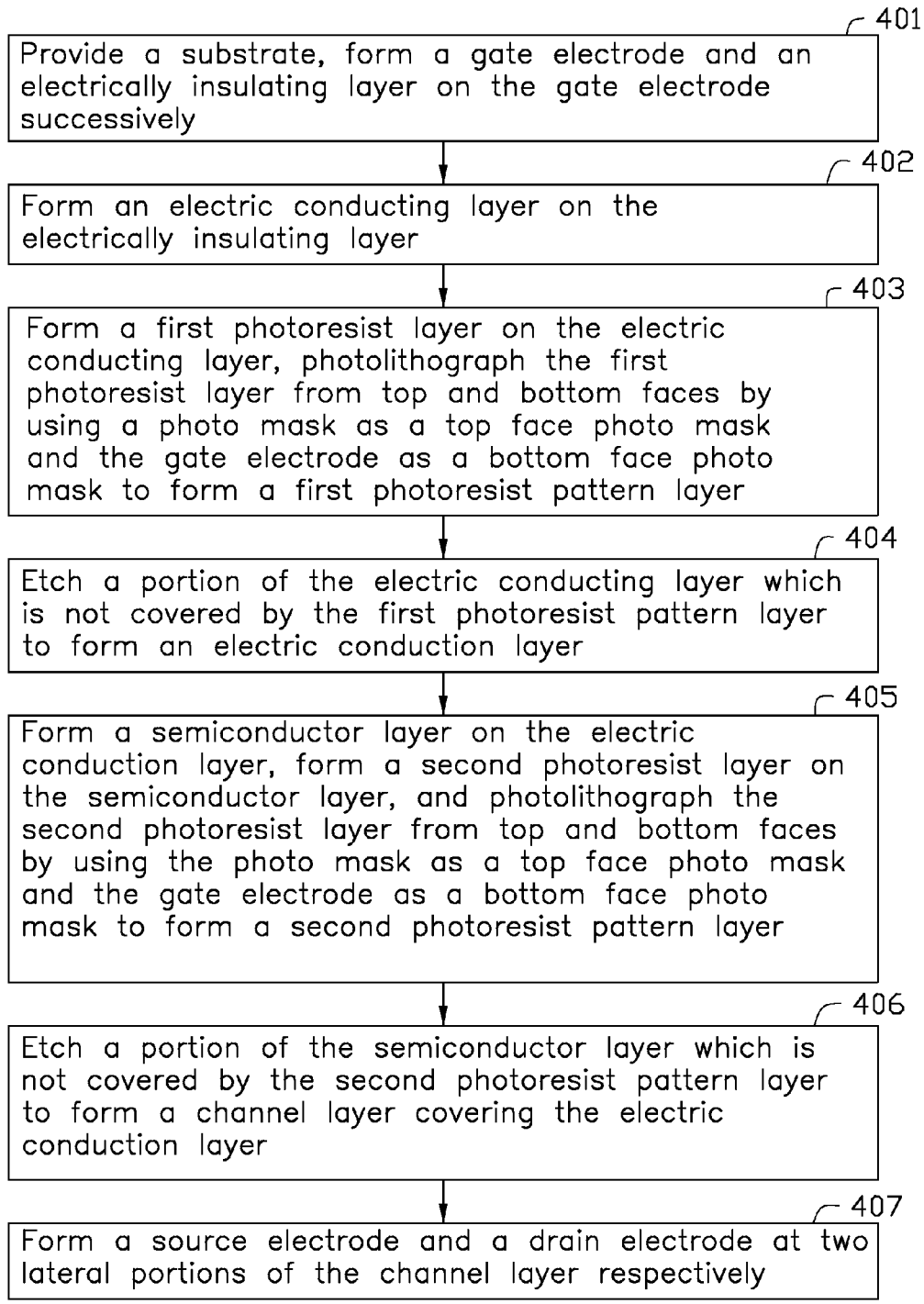
FIG. 4 is a flowchart showing a method for forming the thin film transistor of FIG. 1 in accordance with an embodiment of the present disclosure.

FIG. 4 illustrates a flowchart of an example method for manufacturing the thin film transistor 100 in FIG. 1. The example method is provided by way of example, as there are a variety of ways to carry out the method. The example method described below can be carried out using the configurations illustrated in FIG. 1, for example, and various elements of this figure are referenced in explaining the example method. Each block shown in FIG. 4 represents one or more processes, methods or subroutines, carried out in the example method. Furthermore, the illustrated order of blocks is illustrative only and the order of the blocks can change according to the present disclosure. Additional blocks can be added or fewer blocks may be utilized, without departing from this disclosure. The example method can begin at block 401.

Figure 5:
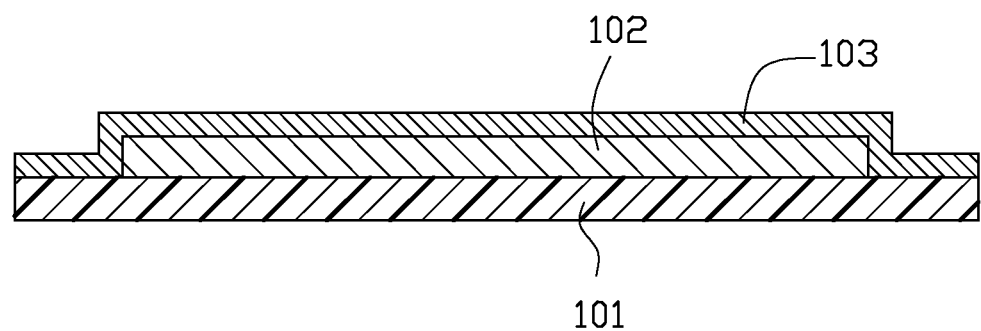
FIG. 5 is a cross-sectional view of a substrate, a gate electrode and an electrically insulating layer.

At block 401, also referring to FIG. 5, in which the substrate 101 is provided, the gate electrode 102 is formed on the substrate 101, and the electrically insulating layer 103 is formed on the gate electrode 102 successively. In least one embodiment, the gate electrode 120 is formed on the middle of the first face of the substrate 101. The electrically insulating layer 103 is formed on the substrate 101 to totally cover the gate electrode 102. The gate electrode 102 can have a length L1, and width L2 (shown in FIG. 12). The electrically insulating layer 103 can cover the top face and the lateral face of the gate electrode 102.

Figure 6:
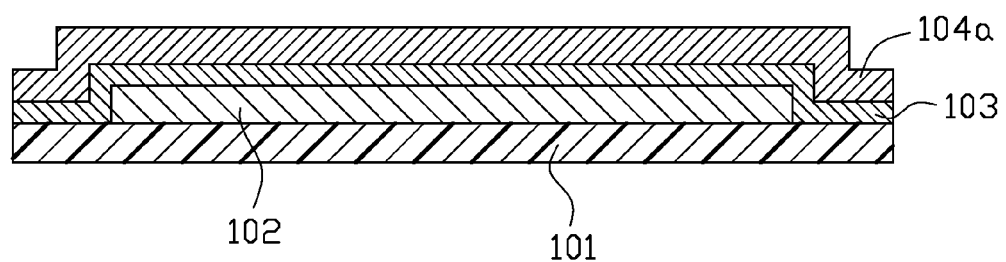
FIG. 6 shows an electric conducting layer formed on the electrically insulating layer 103 in FIG. 5.

At block 402, also referring to FIG. 6, an electric conducting layer 104a is formed on the electrically insulating layer 103. The electric conducting layer 104a can formed on a middle portion of the electrically insulating layer 103. A material of the electric conducting layer 104a can be ITO, ATO, silver nanowire, IZO, carbon nanotubes, or other transparent electric conduction materials.

Figure 7:
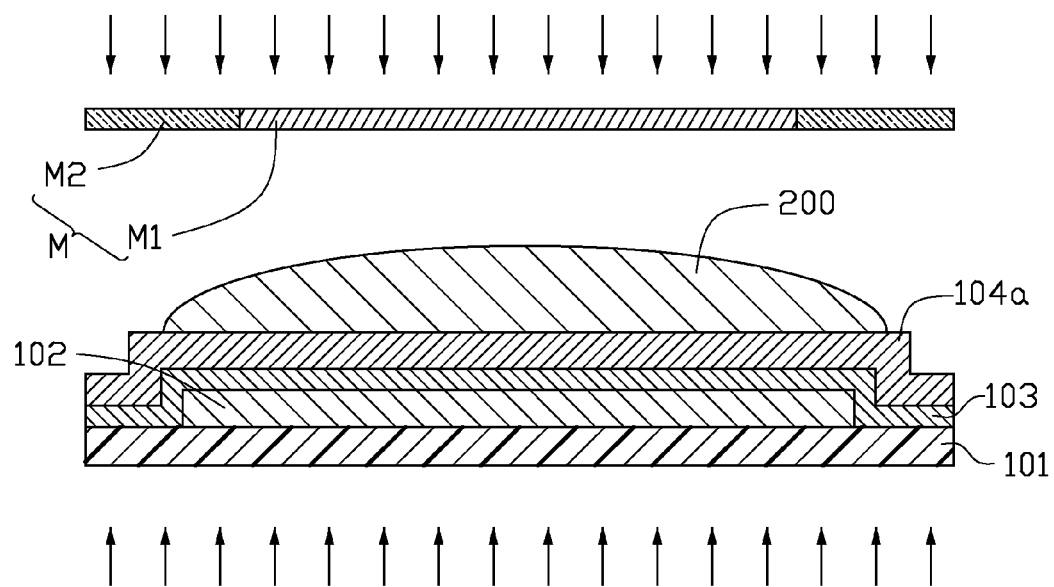
FIG. 7 shows a first photoresist layer formed on the electric conducting layer in FIG. 6, and the first photoresist layer being photolithographed with a photo mask.
Figure 11:
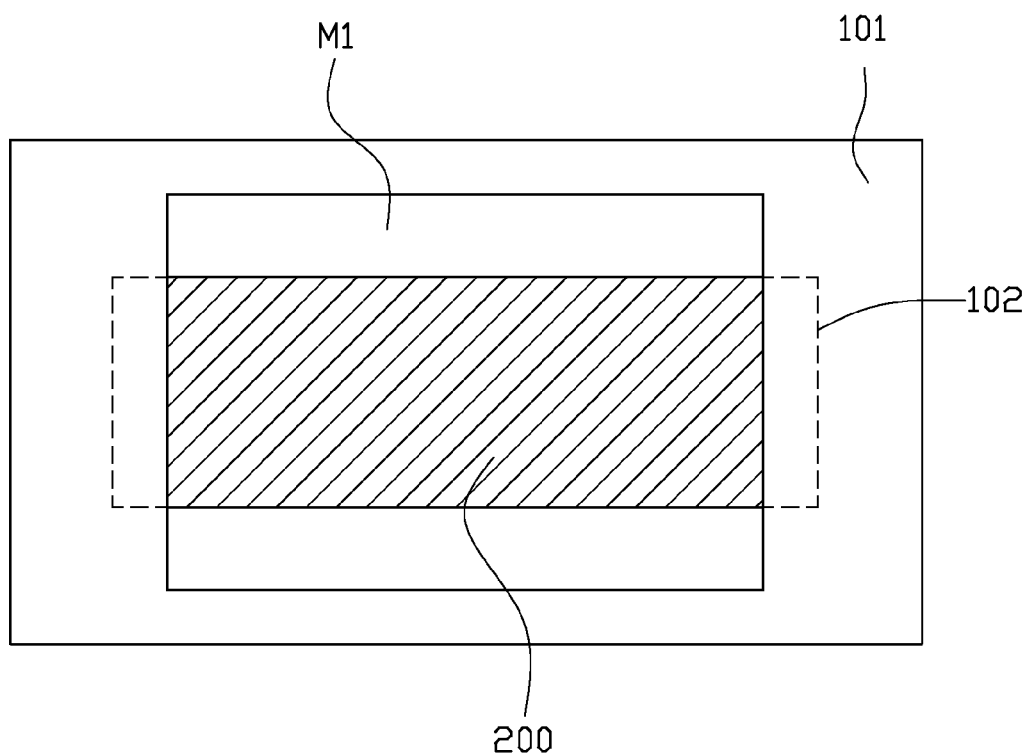
FIG. 11 shows orthographic projections of a photomask and a gate electrode on a substrate shown in FIG. 7.

At block 403, also referring to FIG. 7 and FIG. 11, a first photoresist layer is formed on the electric conducting layer 104a, and the first photoresist layer is photolithographed to form a first photoresist pattern layer 200. In at least one embodiment, a photo mask M is positioned on the first photoresist layer to be used as a top face photo mask, the gate electrode 102 is acted as a bottom face photo mask, the first photoresist layer is photolithographed from the top face and the bottom face to form the first photoresist pattern layer 200.

In at least one embodiment, as FIG. 11 illustrated, the photo mask M can include an opaque zone M1 and a photic zone M2 surrounding the opaque zone M1. The opaque zone M1 has a length L3, and a width L4. An orthographic projection of the opaque zone M1 on the substrate 101 has at least one part thereof overlapped with an orthographic projection of the gate electrode 102 on the substrate 101 to form an overlapped zone, therefore, after the first photoresist layer is photolithographed from the photo mask M and the gate electrode 102, an orthographic projection of the first photoresist pattern layer 200 on the substrate 101 is overlapped with the overlapped zone. In at least one embodiment, the first photoresist layer can be a positive photoresist.

Figure 8:
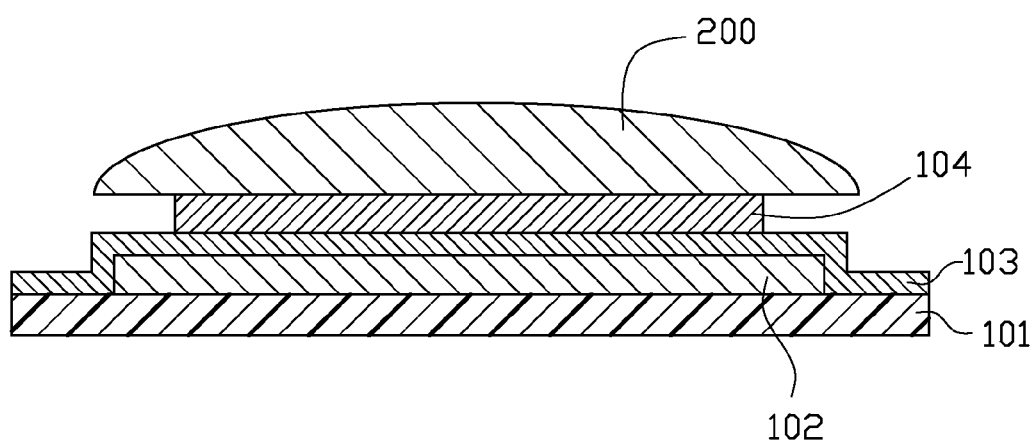
FIG. 8 shows the electric conducting layer in FIG. 7 being etched.

In at least one embodiment, the length L3 of the opaque zone M1 is less than the length L1 of the gate electrode 102. The width L4 of the opaque zone L4 is larger than the width L2 of the gate electrode 102. A width of contacting face of the first photoresist pattern layer 200 adjacent to the electric conducting layer 104a is determined by the gate electrode 102. A length of the contacting face of the first photoresist pattern layer 200 is determined by the opaque zone M1 of the photo mask M At block 404, also referring to FIG. 8, which is not covered by the first photoresist pattern layer 200, of the electric conducting layer 104a is etched to form the electric conduction layer 104.

Figure 9:
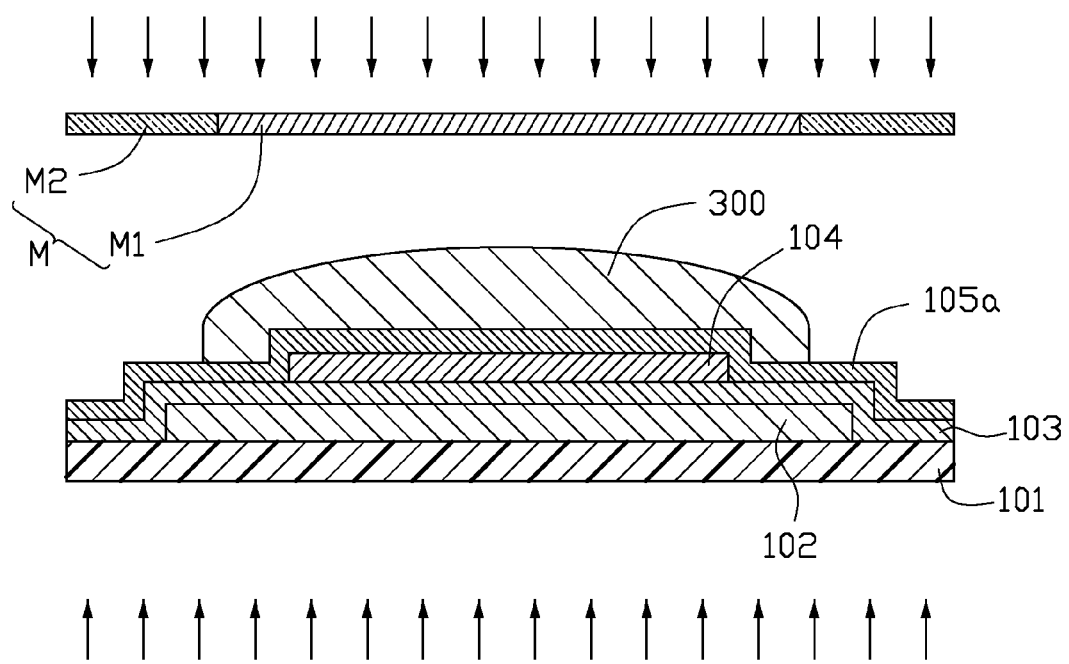
FIG. 9 shows a semiconductor layer formed on the electric conduction layer in FIG. 8.

At block 405, also referring to FIG. 9 and FIG. 11, a semiconductor layer 105a is formed on the electric conduction layer 104. A second photoresist layer is formed on the semiconductor layer 105a. The second photoresist layer is photolithographed to form a second photoresist pattern layer 300. In at least one embodiment, the photo mask M is used as a top face photo mask, the gate electrode 102 is acted as a bottom face photo mask, the second photoresist layer is photolithographed from the top face and the bottom face to form the second photoresist pattern layer 300.

In at least one embodiment, the first and second photoresist layers can have material same to each other. FIG. 11 illustrates that, an orthographic projection of the photo mask M on the substrate 101 has at least one part thereof overlapped with the orthographic projection of the gate electrode 102 on the substrate 101 to form an overlapped zone. An orthographic projection of the second photoresist pattern layer 300 on the substrate 101 is equal to the overlapped zone in area. A width of contacting face of the second photoresist pattern layer 300 adjacent to the semiconductor layer 105a is determined by the gate electrode 102. A length of the contacting face of the second photoresist pattern layer 300 is determined by the opaque zone M1 of the photo mask M.

The orthographic projection of the first photoresist pattern layer 200 is entirely overlapped the orthographic projection of the second photoresist pattern layer 300.

In at least one embodiment, the second photoresist layer can be a positive photoresist.

Figure 10:
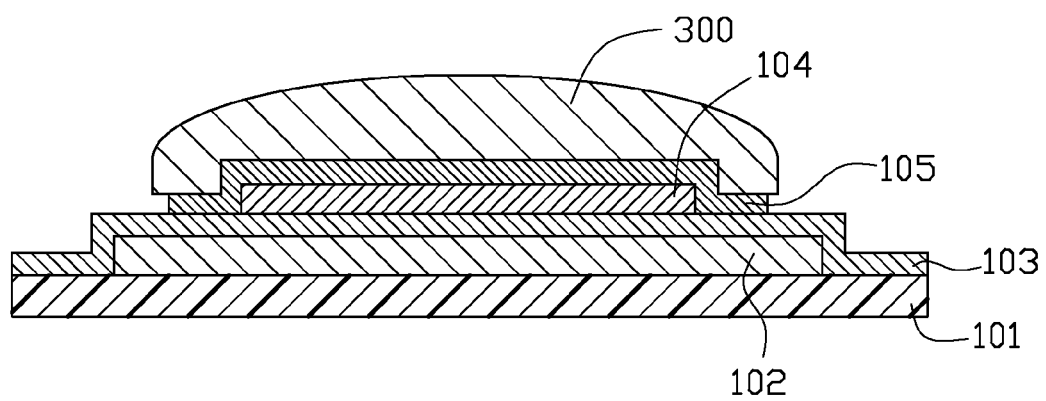
FIG. 10 shows the semiconductor layer being etched to form a channel layer covering the electric conduction layer in FIG. 9.
Figure 12:
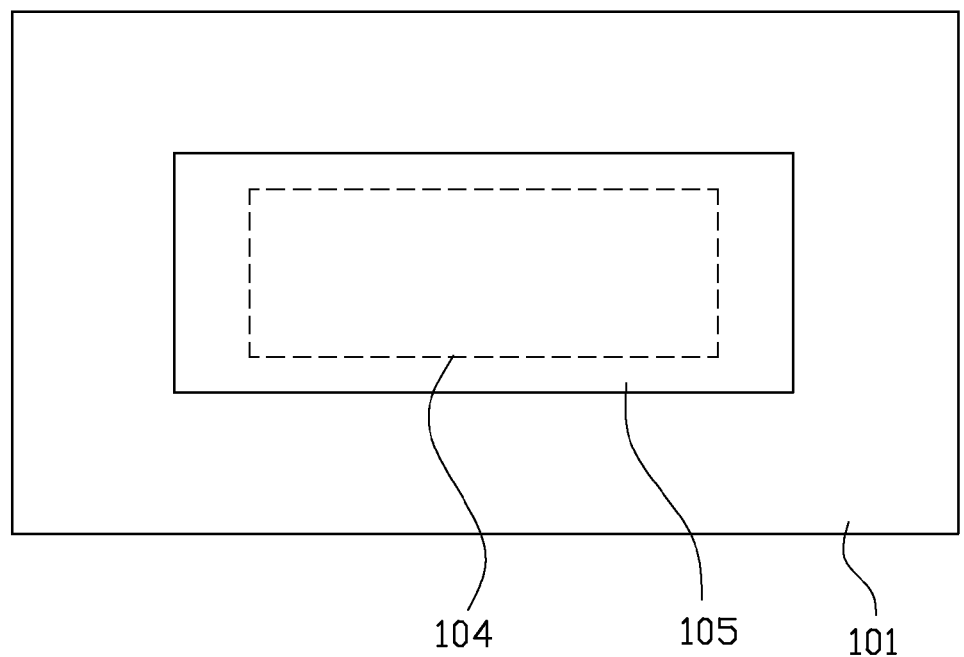
FIG. 12 shows orthographic projections of a channel layer and an electric conduction layer on a substrate shown in FIG. 10.

At block 406, also referring to FIG. 10 and FIG. 12, which is not covered by the second photoresist pattern layer 300, of the semiconductor layer 105a is etched to form the channel layer 105 covering the electric conduction layer 104. The channel layer 105 can entirely cover the top face and the lateral face of the electric conduction layer 104.

When the electric conducting layer 104a and the semiconductor layer 105a are etched, etching rates are adjusted by adjusting etching liquid concentration, etching speed, etching time or choosing different etching liquids to make that an area of an orthographic projection of the electric conduction layer 104 on the substrate 101 is less than that of an area of an orthographic projection of the channel layer 105 on the substrate 101, so that, as FIG. 12 illustrated, the electric conduction layer 104 is covered by the channel layer 105, and is not in contact with the source electrode 107 and the drain electrode 108 (shown in FIG. 1).

In at least one embodiment, by adjusting the etching time, the electric conducting layer 104a and the semiconductor layer 105a are etched to make the area of the orthographic projection of the electric conduction layer 104 on the substrate 101 less than the area of the orthographic projection of the channel layer 105 on the substrate 101. In this embodiment, the etching time for etching the electric conducting layer 104a is different from that from etching the semiconductor layer 105a so that the area of the electric conduction layer 104 is less than that of the channel layer 105. In actual implementation, the etching time can be determined according to the materials of the electric conducting layer 104a and the semiconductor layer 105a and the chosen etching liquids.

At block 407, also referring to FIG. 1, the source electrode 107 and the drain electrode 108 are formed at the two lateral portions of the channel layer 105 respectively, the thin film transistor 100 in FIG. 1 is gotten.

In an alternatively embodiment, after the channel layer 105 is formed, the etch stop layer 106 is formed on the middle portion of the channel layer 105, then the source electrode 107 and the drain electrode 108 are formed on the channel layer 105 and the etch stop layer 106, the thin film transistor 100 in FIG. 2 is gotten.

In another alternatively embodiment, after the channel layer 105 is formed, the etch stop layer 106 is formed to cover the channel layer 105. The etch stop layer 106 has the periphery portion 1061 surrounding the channel layer 105 and the electric conduction layer 104, and the main portion 1062 located on the channel layer 105. The main portion 1062 of the etch stop layer 106 defines two spaced through holes 1063. Then the source electrode 107 and the drain electrode are formed in the through holes 1063 respectively and contact channel layer 105, the thin film transistor 100 in FIG. 3 is gotten.

In the method for manufacturing the thin film transistor 100 in FIG. 3, when the electric conducting layer 104a and the semiconductor layer 105a are etched in block 404 and block 406, due to the channel layer 105 is not needed to entirely cover the electric conduction layer 104 or not, the etching time of etching the electric conducting layer 104a and the semiconductor layer 105a has no strict requirement. In block 407, the etch stop layer 106 needs to entirely cover the top and lateral faces of the channel layer 105 and the electric conduction layer 104.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:
1. A method of manufacturing a thin film transistor, the method comprising:
providing a substrate;
successively forming a gate electrode and an electrically insulating layer on the substrate;
forming an electric conducting layer on the electrically insulating layer;
forming a first photoresist layer on the electric conducting layer;
photolithographing the first photoresist layer from a top face and a bottom face by using a photo mask as a top face photo mask and the gate electrode as a bottom face photo mask to form a first photoresist pattern layer;

etching a portion, which is not covered by the first photoresist pattern layer, of the electric conducting layer to form an electric conduction layer;

forming a semiconductor layer on the electric conduction layer;

forming a second photoresist layer on the semiconductor layer;

photolithographing the second photoresist layer from a top face and a bottom face using the photo mask as a top face photo mask and the gate electrode as a bottom face photo mask to form a second photoresist pattern layer;

etching a portion, which is not covered by the second photoresist pattern layer, of the semiconductor layer to form a channel layer covering the electric conduction layer; and forming a source electrode and a drain electrode at two lateral portions of the channel layer respectively.

2. The method of claim 1, wherein etching time for etching the electric conducting layer is different from that for etching the semiconductor layer.

3. The method of claim 2, wherein an area of the electric conduction layer is less than that of the channel layer.

4. The method of claim 1, wherein orthographic projections of the first photoresist pattern layer and the gate electrode on the substrate are overlapped.

5. The method of claim 4, wherein orthographic projections of the first photoresist pattern layer and the second photoresist pattern layer on the substrate are overlapped.

6. The method of claim 1, wherein the first photoresist layer is a positive photoresist.

7. The method of claim 6, wherein the second photoresist layer is a positive photoresist.

8. The method of claim 1, wherein the electric conducting layer is transparent.

9. The method of claim 1, wherein material of the electric conducting layer is indium tin oxide (ITO), antimony tin oxide (ATO), silver nanowire, indium zinc oxide (IZO), carbon nanotubes, or other transparent electric conduction materials.

10. The method of claim 1, further comprising: forming an etch stop layer on the channel layer after forming the channel layer and before forming the source electrode and the drain electrode.

11. The method of claim 10, wherein the source electrode and the drain electrode are formed on the channel layer and the etch stop layer.

12. The method of claim 10, wherein the etch stop layer comprises a main portion on the channel layer, the main portion defining two spaced through holes, the source electrode and the drain electrode being formed in the through holes, respectively.

13. The method of claim 12, wherein the etch stop layer further comprises a periphery portion surrounding the channel layer and the electric conduction layer.

14. The method of claim 1, wherein the photo mask comprises an opaque zone and a photic zone surrounding the opaque zone.

15. The method of claim 14, wherein a width of a contacting face of the first photoresist pattern layer adjacent to the electric conducting layer is determined by the gate electrode, and a length of the contacting face of the first photoresist pattern layer is determined by the opaque zone of the photo mask.

16. The method of claim 14, wherein a width of a contacting face of the second photoresist pattern layer adjacent to the semiconductor layer is determined by the gate electrode, and a length of the contacting face of the second photoresist pattern layer is determined by the opaque zone of the photo mask.

17. The method of claim 14, wherein a length of the opaque zone is less than a length of the gate electrode, and a width of the opaque zone is larger than a width of the gate electrode.

* * * * *